United States Patent
Grolier et al.

(10) Patent No.: US 8,761,219 B2
(45) Date of Patent: Jun. 24, 2014

(54) OPTOELECTRONIC SEMICONDUCTOR CHIP WITH GAS-FILLED MIRROR

(75) Inventors: Vincent Grolier, München (DE); Andreas Plössl, Regensburg (DE)

(73) Assignee: OSRAM Opto Semiconductors GmbH (DE)

( * ) Notice: Subject to any disclaimer, the term of this patent is extended or adjusted under 35 U.S.C. 154(b) by 199 days.

(21) Appl. No.: 13/002,352

(22) PCT Filed: Aug. 5, 2009

(86) PCT No.: PCT/DE2009/001111
§ 371 (c)(1),
(2), (4) Date: Feb. 23, 2011

(87) PCT Pub. No.: WO2010/020213
PCT Pub. Date: Feb. 25, 2010

(65) Prior Publication Data
US 2011/0164644 A1      Jul. 7, 2011

(30) Foreign Application Priority Data

Aug. 22, 2008   (DE) .......................... 10 2008 039 360

(51) Int. Cl.
*H01S 5/20*      (2006.01)
(52) U.S. Cl.
USPC ............... 372/50.1; 257/94; 257/98; 438/29; 438/69
(58) Field of Classification Search
USPC ...................................... 372/50.1
See application file for complete search history.

(56) References Cited

U.S. PATENT DOCUMENTS

| | | | |
|---|---|---|---|
| 5,502,316 A | 3/1996 | Kish et al. | |
| 5,847,454 A * | 12/1998 | Shaw et al. | 257/734 |
| 2003/0112610 A1* | 6/2003 | Frankowsky et al. | 361/760 |
| 2004/0031690 A1* | 2/2004 | Tanaka et al. | 205/74 |
| 2004/0211968 A1 | 10/2004 | Lin et al. | |
| 2005/0023652 A1* | 2/2005 | Hashimoto | 257/666 |
| 2005/0042786 A1* | 2/2005 | Bieck et al. | 438/38 |
| 2005/0089700 A1* | 4/2005 | Itakura et al. | 428/457 |
| 2007/0145380 A1* | 6/2007 | Shum et al. | 257/79 |
| 2007/0153860 A1* | 7/2007 | Chang-Hasnain et al. | 372/50.124 |

FOREIGN PATENT DOCUMENTS

| | | |
|---|---|---|
| DE | 10 2007 003 282 A1 | 7/2008 |
| JP | 6-302857 | 10/1994 |
| WO | 2007/136392 | 11/2007 |
| WO | 2008/089728 A2 | 7/2008 |

OTHER PUBLICATIONS

Japanese Notification of Reasons for Refusal dated Sep. 2, 2013 (English translation).

* cited by examiner

*Primary Examiner* — Xinning Niu
(74) *Attorney, Agent, or Firm* — DLA Piper LLP (US)

(57) ABSTRACT

An optoelectronic semiconductor chip includes a semiconductor body containing an active region, a mirror layer, and contact points arranged between the semiconductor body and the mirror layer and providing a spacing D between the semiconductor body and the mirror layer, whereby at least one cavity is formed between the mirror layer and the semiconductor body and the at least one cavity contains a gas.

23 Claims, 3 Drawing Sheets

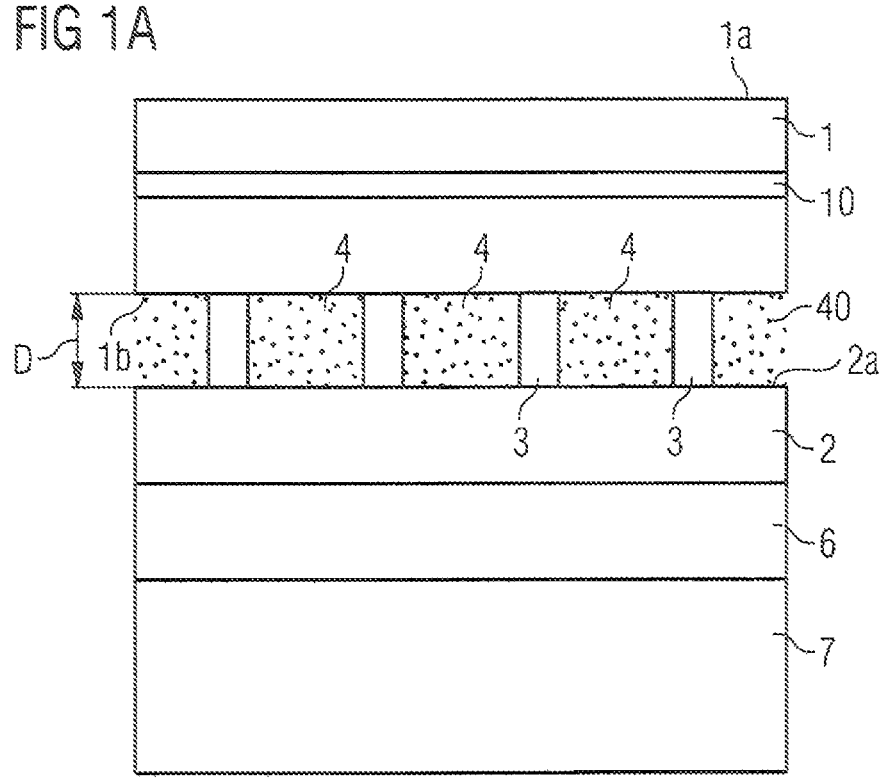
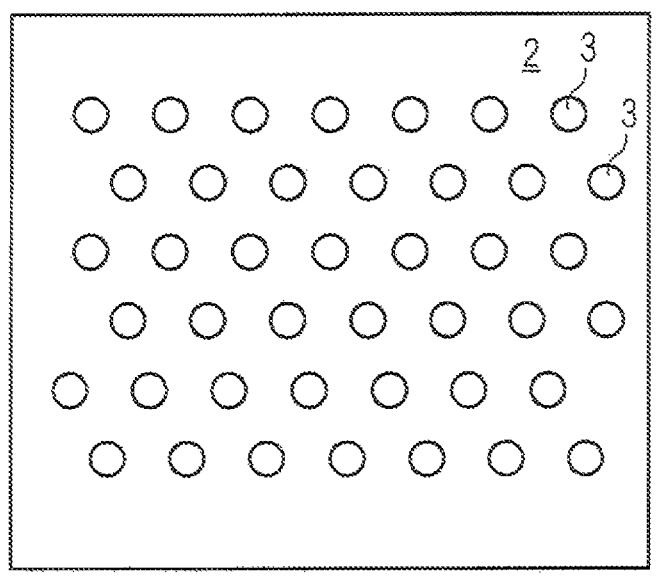

OPTOELECTRONIC SEMICONDUCTOR CHIP WITH GAS-FILLED MIRROR

RELATED APPLICATIONS

This is a §371 of International Application No. PCT/DE2009/001111 with an international filing date of Aug. 5, 2009 (WO 2010/020213 A1, published Feb. 25, 2010), which is based on German Patent Application No. 10 2008 039 360.6, filed Aug. 22, 2008, the subject matter of which is hereby incorporated by reference.

TECHNICAL FIELD

This disclosure relates to an optoelectronic semiconductor chip which exhibits improved efficiency.

SUMMARY

We provide an optoelectronic semiconductor chip including a semiconductor body containing an active region, a mirror layer, and contact points arranged between the semiconductor body and the mirror layer and providing a spacing D between the semiconductor body and the mirror layer, whereby at least one cavity is formed between the mirror layer and the semiconductor body and the at least one cavity contains a gas.

We also provide a method of producing an optoelectronic semiconductor chip including providing a semiconductor body with at least one active region, providing a carrier with a mirror layer, applying contact points to a top portion of the mirror layer and/or a bottom portion of the semiconductor body, and connecting the semiconductor body and the mirror layer by way of the contact points using thermocompression, wherein the contact points provide a spacing D between semiconductor body and mirror layer, whereby at least one cavity is formed between mirror layer and semiconductor body, which cavity contains a gas.

BRIEF DESCRIPTION OF THE DRAWINGS

FIG. 1A is a schematic sectional representation of an optoelectronic semiconductor chip described herein.

FIG. 1B is a schematic plan view of the optoelectronic semiconductor chip according to FIG. 1A, looking onto the mirror layer.

DETAILED DESCRIPTION

Figure 2A:
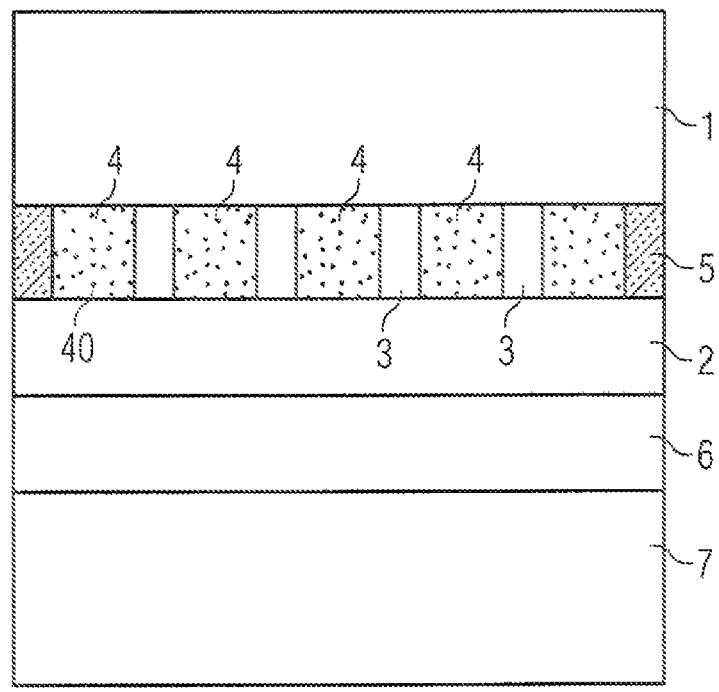
FIG. 2A is a schematic sectional representation of another example of an optoelectronic semiconductor chip described herein.

The semiconductor chip may comprise a semiconductor body, which includes an active region. The semiconductor body is preferably an epitaxially grown semiconductor body. The semiconductor body may be joined to a growth substrate. However, it is also possible for the growth substrate to be removed from the semiconductor body or to be at least thinned. The active region of the semiconductor body is preferably suitable for generating or detecting electromagnetic radiation.

If the active region is suitable for generating electromagnetic radiation, the optoelectronic semiconductor chip is preferably a luminescent diode chip, i.e. the optoelectronic semiconductor chip is formed by a laser diode chip or a light-emitting diode chip. If the active region is suitable for detecting electromagnetic radiation, the optoelectronic semiconductor chip is a detector chip, for example, a photodiode chip. For example, the photodiode chip may be provided for detecting infrared radiation.

The optoelectronic semiconductor chip further comprises a mirror layer. For example, the mirror layer is a metallic mirror layer. This means that the mirror layer consists of or contains a metal and is distinguished by metallic characteristics such as good electrical conductivity and high reflectivity.

It is additionally possible for the mirror layer to be a Bragg mirror, which consists of alternately arranged layers of a high refractive index material and of a low refractive index material.

Furthermore, the mirror layer may be a combination of Bragg mirror and metallic mirror. The metallic mirror in this case for example faces the active region and is arranged on the Bragg mirror.

The mirror layer in this case preferably has a reflectivity of at least 90% for electromagnetic radiation generated or to be detected in the active region.

The optoelectronic semiconductor chip may comprise contact points. The contact points produce a mechanical connection between mirror layer and semiconductor body, i.e. the mirror layer and the semiconductor body are connected mechanically together by way of the contact points. The optoelectronic semiconductor chip in this case comprises at least one of these contact points, preferably the optoelectronic semiconductor chip comprises a plurality of these contact points.

The contact points are arranged between semiconductor body and mirror layer. The contact points may in this case directly adjoin the semiconductor body and/or directly adjoin the mirror layer, i.e. the contact points may be situated for example in direct contact with the semiconductor body and/or in direct contact with the mirror layer.

The contact points in this case provide spacing between the semiconductor body and the mirror layer, i.e. the contact points take the form, for example, of pillars or posts, which, in addition to mechanical fastening, also provide spacing between semiconductor body and mirror layer. This means that the semiconductor body and the mirror layer preferably do not touch one another. Semiconductor body and mirror layer are thus not in direct contact with one another, but rather are separated from one another by the contact points.

Because of the spacing which the contact points provide between semiconductor body and mirror layer, at least one cavity is formed between semiconductor body and mirror layer, i.e. semiconductor body and mirror layer are arranged spaced from one another, a cavity being situated between semiconductor body and mirror layer in places where there are no contact points.

The cavity may contain a gas. The cavity may in this case, for example, be filled with air. However it is also possible for the cavity to be filled with a noble gas such as, for example, helium. Furthermore, the cavity may also be filled with nitrogen or with hydrogen, i.e. the at least one cavity formed by the contact points contains a gas and is preferably filled with this gas. This makes it possible, for example, for semiconductor body, mirror layer and contact points to adjoin the gas in the cavity. The gas is thus situated between semiconductor body and mirror layer at least in the region of the semiconductor body. It is here possible for solely the contact points and the gas to be situated between semiconductor body and mirror layer. No other material is then situated between semiconductor body and mirror layer.

The optoelectronic semiconductor chip may comprise a semiconductor body containing an active region. Furthermore, the semiconductor chip contains a mirror layer and contact points, which are arranged between semiconductor body and mirror layer. The contact points in this case bring about spacing between semiconductor body and mirror layer, whereby at least one cavity is formed between mirror layer and semiconductor body. The at least one cavity in this case contains a gas.

The contact points may be provided for electrical contacting of the active region of the semiconductor body, that is to say, when the optoelectronic semiconductor chip is in operation, an electric current is impressed via the contact points into the semiconductor body and thus into the active region, which current makes it possible for electromagnetic radiation to be generated or detected in the active region. In this case, the contact points are preferably electrically conductive.

The optoelectronic semiconductor chip described herein is based inter alia on the recognition that filling the cavity between mirror layer and semiconductor body with a gas has advantages over filling the cavity with a dielectric solid such as for example silicon nitride or silicon oxide.

On the one hand, filling the cavity with a gas results in a particularly large refractive index jump between semiconductor body and cavity. As a result of this large refractive index jump, a particularly small angle for total reflection is achieved for electromagnetic radiation arriving at the boundary surface between semiconductor body and cavity. The boundary surface between semiconductor body and cavity therefore serves as a mirror due to the large difference in refractive index. The "gas mirror" formed in this way therefore enables improved reflection for flat angles. Electromagnetic radiation with steep angles of incidence is reflected by the mirror layer, which is metallic and/or takes the form of a Bragg mirror.

Electromagnetic radiation generated in the active region and emitted in the direction of the cavity may be reflected at the boundary surface by total reflection and deflected towards a radiation exit face or an active region of the semiconductor body. The same applies to electromagnetic radiation which is to be detected in the active region. Electromagnetic radiation which is not totally reflected, but rather penetrates the boundary surface between semiconductor body and cavity impinges on its course on the contact points and/or the mirror layer and is reflected by these elements towards a radiation exit face and/or towards the active region of the optoelectronic semiconductor chip.

By filling the cavity with a gas, i.e. forming a cavity between semiconductor body and mirror layer by the contact points, the efficiency of the optoelectronic semiconductor chip is thus increased. Furthermore, filling the cavity with a gas has also proven particularly advantageous for improved heat removal. As a result of gas being introduced into the cavity, heat generated in the optoelectronic semiconductor chip during operation may be dissipated particularly well from the semiconductor body to the mirror layer and from there, for example, to a carrier. For improved heat removal, it is particular effective to fill the cavity with helium or with hydrogen ($H_2$). However, other gases such as nitrogen or argon are also feasible.

The gas-filled cavity thus replaces a dielectric material, for example, a dielectric mirror layer. It is distinguished over such a material by improved optical and thermal properties. All in all, the gas-filled cavity thus contributes to improved efficiency of the optoelectronic semiconductor chip.

At least one of the contact points may form a closed track, i.e. at least one of the contact points has a, for example, frame-like profile. This contact point thus extends continuously and surrounds a region between the mirror layer and the semiconductor body.

In other words, the contact point surrounds at least one region between the mirror layer and the semiconductor body in the manner of a frame, wherein "in the manner of a frame" does not indicate the geometry of this contact point. For example, the contact point may take the form of a round, rectangular or oval frame. The contact point configured as a closed track is preferably arranged in the peripheral area of the optoelectronic semiconductor chip.

This means, for example, that a frame-like contact point is arranged at the edge of the semiconductor body on the side of the semiconductor body facing the mirror layer, which contact point extends as a closed track around the edge of the semiconductor body. The contact point may be in direct contact with the mirror layer and/or the semiconductor body. Such a contact point, which forms a closed track, is particularly suitable for forming a particularly large cavity between mirror layer and semiconductor body, which is filled with the gas. This contact point then encloses and also hermetically seals the gas in the cavity formed by the contact point, the mirror layer and the semiconductor body.

In the cavity sealed by the contact point formed as a closed numerous further contact points are preferably arranged, which may take the form of posts and pillars. On connection of semiconductor body and mirror layer, a highly thermally conductive gas may thus be tightly enclosed in the optoelectronic semiconductor chip by a contact point configured as a closed track extending continuously at the edge.

The at least one cavity may be sealed with a passivation material. The passivation material may, for example, be applied in the peripheral region of the optoelectronic semiconductor chip around the optoelectronic semiconductor chip. The passivation material may be used as an alternative or in addition to a contact point configured as a closed track. The passivation material may, for example, be leakproof with regard to gas enclosed in the cavity between mirror layer and semiconductor body. The passivation material then forms a seal for the gas. The passivation material may therefore be used in addition or as an alternative to a contact point configured as a closed track.

The gas may be enclosed in at least one of the cavities at a pressure lower than standard pressure. If the cavity formed between mirror layer and semiconductor body is sealed by a contact point configured as a closed track and/or a passivation material, it is possible to introduce the gas between mirror layer and semiconductor body at this pressure, which is lower than standard external pressure. A gas introduced at reduced pressure improves the thermal characteristics of the gas in the cavity, i.e. thermal dissipation by the gas in the cavity is further improved in this case. The gas is preferably sealed in the cavity at a pressure of between 0.9 and 1.1 bar. It is also possible, however, to seal gas in the cavity at an overpressure. In particular, pressure ranges of between 1 mbar and 5 bar are feasible.

The spacing between mirror layer and semiconductor body may be at least 10 nm and preferably at most 10 p.m. The spacing is here brought about by the contact points, i.e. the contact points preferably have a height of at least 10 nm and at most 10 μm. The spacing between mirror layer and semiconductor body amounts, for example, to between 100 nm and 1 μm. The indicated range for the spacing between mirror layer and semiconductor body has been shown to be optimal with regard to the heat dissipation which takes place from the semiconductor body towards the mirror layer as a result of the gas in at least one cavity.

Contact points and mirror layer may contain at least one metal in common, that is to say contact points and mirror layer may in each case contain at least one metal. Contact points and mirror layer have in common at least one of the metals they contain. For example, both contact points and mirror layer contain silver, aluminium or gold.

The contact points and the mirror layer may consist of the same material. For example, contact points and mirror layer consist of aluminium, silver or gold.

The contact points may contain at least one solder material. For example, the contact points here contain at least one of the following solder materials: tin, indium, gallium, bismuth. These solder materials are distinguished by a particularly low melting point. Contact points containing at least one of these solder materials may be applied particularly well to the semiconductor body and the mirror layer by soldering.

For example, a silver-tin or silver-indium compound may be used as solder for the contact points. The contact points may be applied to the semiconductor body during production of the semiconductor chip, wherein the contact points may also contain barrier or coupling layers facing the semiconductor body. These layers may, for example, improve adhesion of the contact points to the semiconductor body or prevent diffusion of metal such as, for example, silver from the contact points into the semiconductor body.

The semiconductor body with the contact points is then bonded to the mirror layer, which is, for example, applied to a carrier. An Ag—Sn phase or an Ag—In phase then forms, for example, which ensures that the semiconductor chip displays heat resistance during further processing, for example, during soldering to a printed circuit board, that is to say bonding preferably takes place by means of isothermal solidification. The phases formed have a remelting point which is higher than the bonding temperature. This brings with it advantages with regard to further processing of the chip after bonding and during operation of the chip, since the likelihood of undesired detachment of the bonded joint is reduced.

A method of producing such an optoelectronic semiconductor chip is additionally provided. The method is preferably suitable for producing an optoelectronic semiconductor chip, that is to say an optoelectronic semiconductor chip described herein may be produced with the described method. All the features disclosed in relation to the optoelectronic semiconductor chip are therefore also disclosed in relation to the method.

The method may thus comprise the following steps:

First, a semiconductor body is provided, which comprises at least one active region, which may be provided, for example, for generating or detecting radiation. In addition, a carrier is provided, onto which a mirror layer has been applied. Between carrier and mirror layer, a layer or layer sequence serving as a diffusion barrier for material from the mirror layer may, for example, also be arranged. In the next method step the bottom of the semiconductor body is applied onto the top of the mirror layer, which is remote from the carrier. To this end, first of all contact points are applied to the top of the mirror layer and/or to the bottom of the semiconductor body, that is to say the contact points may be applied to the mirror layer, to the semiconductor body or to both those elements. In a final method step, semiconductor body and mirror layer are joined together by the contact points, by thermocompression. This thermocompression joins the contact points in mechanically fixed manner to the semiconductor body and the mirror layer.

The thermocompression preferably proceeds at temperatures of between 150° C. and 450° C. The pressure is set to between 0.4 MPa and 15 MPa. The thermocompression proceeds, depending on temperature and pressure, for a period of between 2 minutes and 10 hours, wherein the thermocompression lasts longer, the lower the temperature and pressure are set.

The contact points may consist of the same material as the mirror layer. For example, the mirror layer consists of a silver layer, which is deposited, for example, using PVD (physical vapor deposition). Silver contact points are then introduced between the mirror layer and the semiconductor body. For example, the contact points may be applied using a printing method such as screen printing or inkjet printing, by PVD or as preformed particles, in particular as beads.

Turning now to the drawings, the optoelectronic semiconductor chip described herein and the method described herein are explained in greater detail below with reference to examples and the associated Figures.

Identical, similar or identically acting elements are provided with the same reference numerals in the Figures. The Figures and the size ratios of the elements illustrated in the Figures relative to one another are not to be regarded as being to scale. Rather, individual elements may be illustrated on an exaggeratedly large scale for greater ease of depiction and/or better comprehension.

The schematic sectional representation of FIG. 1A shows an optoelectronic semiconductor chip described herein according to a first example. The semiconductor chip comprises a semiconductor body 1.

The semiconductor body 1 was produced epitaxially, for example. A growth substrate originally arranged on the top 1a of the semiconductor body 1 has been removed from the semiconductor body 1. The optoelectronic semiconductor chip is therefore a "thin-film chip". The semiconductor body 1 comprises an active region 10. The active region is for example provided for generating or detecting radiation. The bottom 1b of the semiconductor body 1 faces the top 2a of the mirror layer 2. The mirror layer consists for example of silver, gold or aluminium. If aluminium is used for the mirror layer, then before the mirror layer 2 is joined to the semiconductor body 1 the aluminium is preferably treated with a flux which removes the oxide layer from the top 2a of the mirror layer 2.

Semiconductor body 1 and mirror layer 2 are connected together mechanically and electrically by contact points 3, which take the form, for example, of posts or pillars.

The contact points 3 may be formed of a solder system, which contains the material of the mirror layer 2 and at least one low-melting-point solder material such as tin, indium, gallium or bismuth. If the mirror layer consists of silver, for example, the contact points 3 preferably contain a silver-tin or a silver-indium solder. If the contact layer 2 consists of gold, the contact points 3 preferably contain a gold-indium solder. If the mirror layer 2 consists of aluminium, the contact points 3 are preferably formed of an aluminium-gallium solder. The contact points 3 may preferably comprise barrier and coupling agent layers on their side facing the semiconductor body 1.

The barrier layer may, for example, contain at least one of the following materials or consist of one of the following materials: Ni, Pd, Pt, Ti, TiW, TiN, TiW:N.

The coupling agent layer may, for example, contain at least one of the following materials or consist of one of the following materials: Cr, Ni, Pd, Pt, Ti.

As an alternative to a solder material, the contact points 3 may also be formed of the same material as the mirror layer 2. In this case the semiconductor body 1 and the mirror layer 2 are preferably joined together using thermocompression.

The contact points 3 establish a spacing D between semiconductor body 1 and mirror layer 2. As a result of spacing D, at least one cavity 4 arises between semiconductor body 1 and mirror layer 2. In this example, precisely one cavity 4 arises in which a number of contact points 3 are arranged (cf. also the schematic plan view of the mirror layer 2 in FIG. 1B). The cavity is then filled with a gas 40 such as air. Spacing of at least 100 nm and at most 1500 nm, preferably 1000 nm, has proven to be the optimum spacing.

The semiconductor chip additionally comprises a carrier 7, onto which the mirror layer 2 is applied. A barrier layer 6 may be arranged between carrier 7 and mirror layer 2, which barrier layer 6 prevents diffusion of metal from the mirror layer 2 towards the carrier 7.

The carrier 7 may contain a metal or consist of a metal. For example, the carrier may be formed of a molybdenum foil. It is additionally possible for the carrier to contain a ceramic material such as aluminium oxide or to consist of such a material. Finally, the carrier may contain a semiconductor material or consist of such a material. The following are examples of possible such materials: silicon, germanium, GaAs.

The barrier layer 6 may, for example, contain at least one of the following materials or consist of one of the following materials: Ni, Pd, Pt, Ti, TiW, TiN, TiW:N. The contact points 3 conduct the electric current from the carrier 7 to the semiconductor body 1 and some of the heat flow from the semiconductor body 1 to the carrier 7. The density and size of the contact dots, i.e. the contact points 3, have to be kept respectively as low or small as possible to keep the mirror layer 2 and the refractive index jump at the cavity 4 as effective as possible. At the same time, the density and size of the contact dots have respectively to be sufficiently high or large for the chip to be electrically and thermally loadable while remaining mechanically stable. It has proven advantageous for the size of the contact points 3, i.e. the diameter, to be at least 1 μm and at most 50 μm. The density of the contact points 3 preferably corresponds to 0.5% to 50% surface coverage of the mirror layer 2.

The contact dots may be arranged, for example, at the grid points of a regular grid, for example, a rectangular or triangular grid. Contact points 3 may be introduced between the mirror layer 2 and the semiconductor body 1 or applied to these components as preformed particles or using PVD or a printing method.

To protect the gas mirror with the contact points 3 against various etching steps, it is additionally feasible to include a sacrificial layer for the processing period, i.e. a sacrificial layer is applied to the side faces of the chip, which allows further processing of the chip without the possibility of the contact points 3 being etched. This sacrificial layer may be removed once the production process is complete and, for example, contain one of the following materials or consist of one of the following materials: negative photoresist, positive photoresist, silicon nitride, silicon oxide.

Figure 2B:
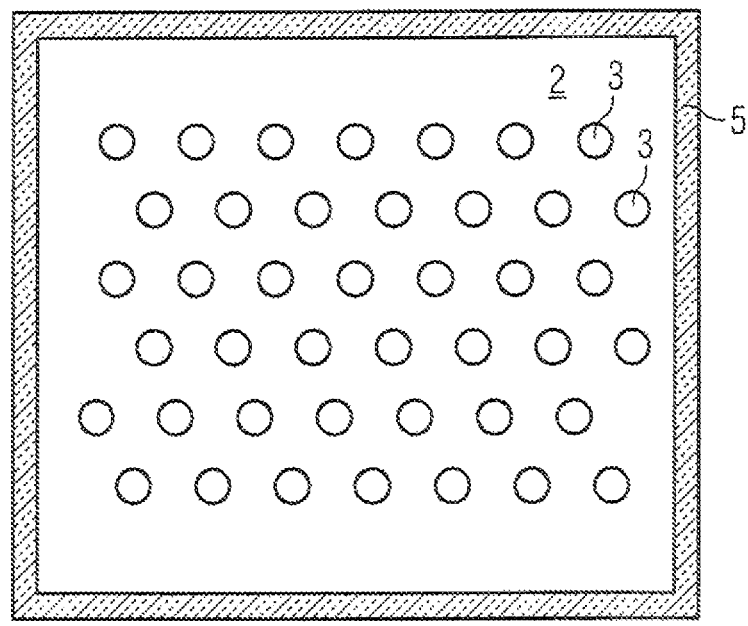
FIG. 2B is a schematic plan view of the optoelectronic semiconductor chip according to FIG. 2A, looking onto the mirror layer.

A second example of an optoelectronic semiconductor chip described herein is explained in greater detail with reference to FIGS. 2A and 2B. In addition to the example described in relation to FIGS. 1A and 1B, in this example a passivation material 5 is arranged around the cavity between semiconductor body 1 and mirror layer 2 in the manner of a frame. The passivation material 5 hermetically seals the cavity 4. In this way, a gas 40 other than air may be introduced into the cavity 4. Helium or hydrogen $H_2$ may, for example, be used for this purpose, these being distinguished by a particularly high level of thermal conductivity. The gas may also be introduced between semiconductor body 1 and mirror layer 2 at a pressure lower than standard pressure, further increasing thermal conductivity. The passivation material 5 may, for example, contain one of the following materials or consist of one of the following materials: silicon nitride, silicon oxide, silicone, bisbenzocyclobutene.

Figure 3A:
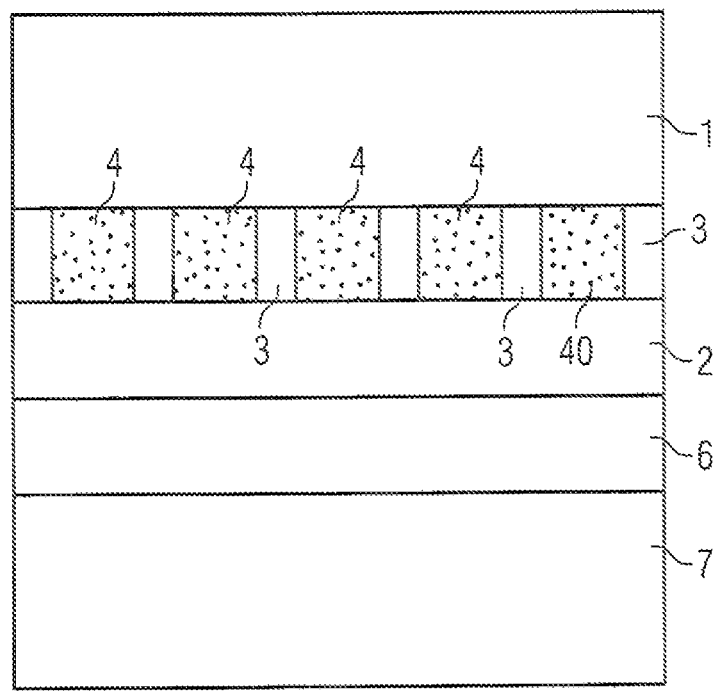
FIG. 3A is a schematic sectional representation of yet another example of an optoelectronic semiconductor chip described herein.
Figure 3B:
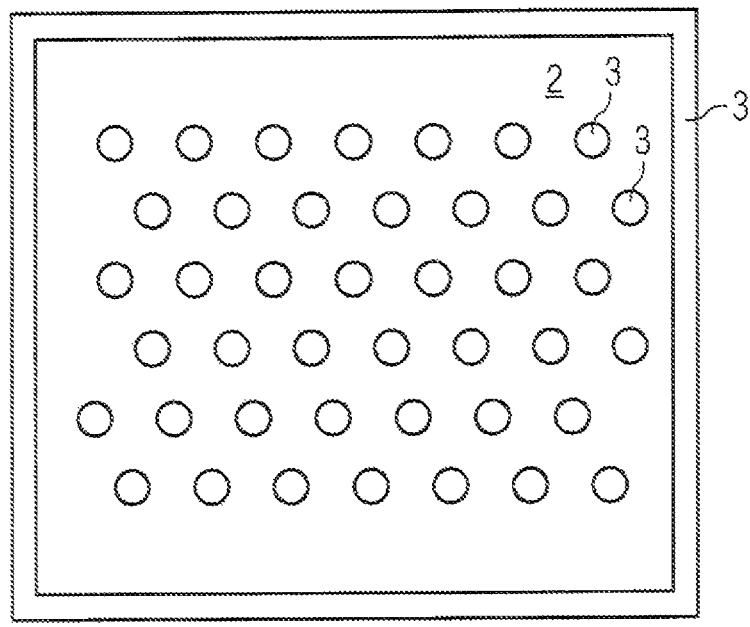
FIG. 3B is a schematic plan view of the optoelectronic semiconductor chip according to FIG. 3A, looking onto the mirror layer 2.

A third example of an optoelectronic semiconductor chip described herein is explained in greater detail with reference to FIGS. 3A and 3B. In this example, unlike in the example of FIGS. 1A and 1B, one contact point 3 takes the form of a closed track. This contact point 3 surrounds further contact points 3 in the manner of a frame. The contact point 3 in the form of a closed track is arranged in the peripheral area of the chip. In addition to its electrical and optical characteristics, the contact point 3 also serves to seal the cavity 4 between semiconductor body and mirror layer hermetically. In this way, a gas 40 at a pressure lower than standard pressure may be sealed in the optoelectronic semiconductor chip.

Such a frame-like contact layer has proven particularly advantageous in optoelectronic semiconductor chips with a large-area mirror layer 2, in which the absorption occurring at the edge in the contact point 3 is less significant than with smaller chips. If the contact point 3 in the form of a closed track is used with smaller chips, it is advisable for the contact point 3 to be made of silver, which has a high reflectivity. In this way, virtually no absorption losses then occur at the contact point 3 taking the form of a closed track. Chips with an edge length greater than 500 μm are described as large chips. Small chips are accordingly smaller.

The semiconductor chips described herein may be contacted in various ways: A structured top contact such as, for example, a bond pad, may be used, together with a whole-area bottom contact. Furthermore, two structured top contacts, for example, two bond pads may be used. Two structured bottom contacts may additionally be used—the semiconductor chip may then be mounted and electrically connected as a flip chip, for example.

The description made with reference to the example does not restrict this disclosure to these examples. Rather, the disclosure encompasses any novel feature and any combination of features, including in particular any combination of features in the appended claims, even if this feature or this combination is not itself explicitly indicated in the claims or examples.

The invention claimed is:

1. An optoelectronic semiconductor chip comprising:
   a semiconductor body containing an active region,
   a mirror layer, and
   contact points arranged between the semiconductor body and the mirror layer and providing a spacing D between the semiconductor body and the mirror layer, whereby at least one cavity is formed between the mirror layer and the semiconductor body and the at least one cavity contains a gas,
   wherein 1) the semiconductor body is free of a material of the mirror layer and the mirror layer projects beyond all of the contact points in a lateral direction, and 2) the lateral direction runs parallel to an area of a main extension of a topside of the semiconductor body.

2. The chip according to claim 1, in which at least one contact point forms a closed track.

3. The chip according to claim 1, in which, when the chip is in operation, an electric current is impressed at least via one of the contact points into the active region.

4. The chip according to claim 1, in which the at least one cavity is sealed with a passivation material.

5. The chip according to claim 1, in which the gas is enclosed in at least one of the cavities at a pressure lower than standard pressure.

6. The chip according to claim 1, in which the contact points are in direct contact with the semiconductor body.

7. The chip according to claim 1, in which the spacing D between the mirror layer and the semiconductor body is at least 10 nm and at most 10 µm.

8. The chip according to claim 1, in which the contact points and the mirror layer have at least one metal in common.

9. The chip according to claim 1, in which the contact points and the mirror layer consist of the same material.

10. The chip according to claim 1, in which the contact points contain at least one solder material selected from the group consisting of Sn, In, Ga and Bi.

11. A method of producing an optoelectronic semiconductor chip comprising:
provided a semiconductor body with at least one active region,
providing a carrier with a mirror layer,
applying contact points to a top portion of the mirror layer and/or a bottom portion of the semiconductor body, and
connecting the semiconductor body and the mirror layer by way of the contact points using thermocompression, wherein the contact points provide a spacing D between semiconductor body and mirror layer, whereby at least one cavity is formed between mirror layer and semiconductor body, which cavity contains a gas,
wherein 1) the semiconductor body is free of a material of the mirror layer and the mirror layer projects beyond all of the contact points in a lateral direction, and 2) the lateral direction runs parallel to an area of a main extension of a topside of the semiconductor body.

12. The method according to claim 11, wherein the contact points consist of the same material as the mirror layer.

13. The method according to claim 11, wherein the contact points are applied using a printing method.

14. The method according to claim 11, wherein the contact points are applied by vapor deposition.

15. The method according to claim 11, wherein the contact points are applied as particles.

16. The method according to claim 11, wherein the contact points are applied as beads.

17. The method according to claim 12, wherein the contact points are applied using a printing method.

18. The method according to claim 12, wherein the contact points are applied by vapor deposition.

19. The method according to claim 12, wherein the contact points are applied as particles.

20. The method according to claim 12, wherein the contact points are applied as beads.

21. An optoelectronic semiconductor chip comprising:
a carrier,
a semiconductor body containing an active region,
a mirror layer applied on the carrier, and
contact points arranged between the semiconductor body and the mirror layer and providing a spacing D between semiconductor body and mirror layer, whereby at least one cavity is formed between the mirror layer and the semiconductor body and the at least one cavity contains a gas,
wherein 1) the semiconductor body is free of a material of the mirror layer and the mirror layer projects beyond all of the contact points in a lateral direction, and 2) the lateral direction runs parallel to an area of a main extension of a topside of the semiconductor body.

22. The chip according to claim 21, wherein the mirror layer comprises a Bragg mirror.

23. The chip according to claim 21, wherein the mirror layer comprises a combination of a Bragg mirror and a metallic mirror.

* * * * *